United States Patent [19]

Takeoka et al.

[11] Patent Number: 5,789,773
[45] Date of Patent: Aug. 4, 1998

[54] SEMICONDUCTOR LIGHT-EMITTING DEVICE

[75] Inventors: Tadashi Takeoka, Nara; Sadayoshi Matsui, Tenri, both of Japan

[73] Assignee: Sharp Kabushiki Kaisha, Osaka, Japan

[21] Appl. No.: 724,215

[22] Filed: Oct. 1, 1996

[30] Foreign Application Priority Data

Oct. 2, 1995 [JP] Japan .................. 7-255182

[51] Int. Cl.$^6$ .................................. H01L 33/00
[52] U.S. Cl. ..................... 257/101; 372/44; 372/45; 372/50; 257/102; 257/97
[58] Field of Search ..................... 257/101; 372/44, 372/50, 45, 102, 97

[56] References Cited

U.S. PATENT DOCUMENTS

| | | | |
|---|---|---|---|
| 4,916,708 | 4/1990 | Hayakawa | 257/191 |
| 5,214,663 | 5/1993 | Kakimoto et al. | 372/45 |
| 5,617,438 | 4/1997 | Hatano | 257/101 |

FOREIGN PATENT DOCUMENTS

| | | |
|---|---|---|
| 4-74487 | 3/1992 | Japan . |
| 04-206585 | 7/1992 | Japan . |
| 04-283979A | 10/1992 | Japan . |
| 4-275479 | 10/1992 | Japan . |
| 4-317385 | 11/1992 | Japan . |
| 6-244492 | 9/1994 | Japan . |
| 6-302852 | 10/1994 | Japan . |

OTHER PUBLICATIONS

Ilegems, "Beryllium Doping and Diffusion in Molecular–Beam Epitaxy of GaAs and $Al_xGa_{1-x}As$", Journal of Applied Physics, vol. 48, No. 3, pp. 1278–1287, 1977.

Ilegems, "Beryllium Doping and Diffusion in Molecular–Beam Epitaxy of Gaas and ALXGA1–AS", Journal of Applied Physics, vol. 48, No. 3, Mar. 1977, pp. 1278–1287.

*Primary Examiner*—Jerome Jackson
*Attorney, Agent, or Firm*—Nixon & Vanderhye P.C.

[57] ABSTRACT

In an AlGaInP type semiconductor light-emitting device, an n-type AlGaInP cladding layer and a p-type AlGaInP cladding layer are deposited so as to interpose an active layer made of GaInP or AlGaInP therebetween. Light guiding layers are provided between the active layer and the n-type cladding layer, and/or, between the active layer and the p-type cladding layer, respectively. The p-type cladding layer is doped with Be serving as a p-type dopant. The active layer, the p-type cladding layer and the light guiding layers are doped with Si which may serve as an n-type dopant.

5 Claims, 6 Drawing Sheets

SEMICONDUCTOR LIGHT-EMITTING DEVICE

BACKGROUND OF THE INVENTION

1. Field of the Invention

The present invention relates to a semiconductor light-emitting device such as a semiconductor laser device. In particular, the present invention relates to an AlGaInP type semiconductor light-emitting device suitable for use in an optical information processing system such as a magneto-optical disk or an optical disk, which can provide high reliability even when oscillating with a short wavelength and/or at a high output power.

2. Description of the Related Art

Recently, an AlGaInP type semiconductor laser device has been put into practical use as a light source for recording and reading out data (information) in an optical information processing system such as a magneto-optical disk or an optical disk. In the case where a semiconductor laser device is used as a light source for such an optical information system, it is necessary to shorten an oscillation wavelength of the semiconductor laser device in order to record information at a high density. Furthermore, in order to overwrite information at a higher speed, it is necessary for the semiconductor laser device to oscillate at a higher output power. In particular, in order to allow the AlGaInP type semiconductor laser device to oscillate with a short wavelength and/or at a high output power, it is important to appropriately control the overflow of electrons from an active layer included in a layered structure for laser oscillation toward layers in the vicinity of the active layer.

Figure 4:
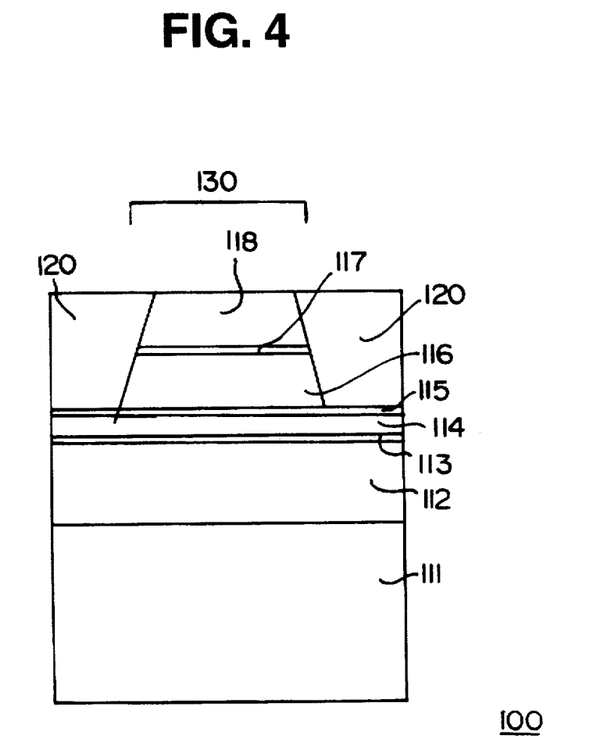
FIG. 4 is a cross-sectional view showing a conventional semiconductor laser device.

FIG. 4 is a cross-sectional view showing the structure of a conventional AlGaInP type semiconductor laser device 100.

The semiconductor laser device 100 includes an n-type AlGaInP cladding layer 112, an undoped GaInP active layer 113, a p-type AlGaInP lower cladding layer 114, a p-type GaInP etching stop layer 115, a p-type AlGaInP upper cladding layer 116, a p-type GaInP intermediate band gap layer 117, and a p-type GaAs contact layer 118. These layers are successively deposited on an n-type GaAs substrate 111 in this order in a first growth process. The peripheral part of the p-type AlGaInP upper cladding layer 116, the p-type GaInP intermediate band gap layer 117 and the p-type GaAs contact layer 118 is removed by photolithography, thereby forming a stripe-shaped ridge 130. N-type GaAs current blocking layers 120 are formed in a second growth process so as to bury the stripe-shaped ridge 130.

In the fabrication process of the thus configured semiconductor laser device 100, each of the semiconductor layers is grown by a molecular beam epitaxy (MBE) method, a metalorganic chemical vapor deposition (MOCVD) method or the like. The overflow of electrons from the active layer is controlled by increasing a doping concentration of the p-type cladding layer to heighten the barrier effect for the electrons included in the active layer.

The MOCVD method, which is widely used in the fabrication of the AlGaInP type semiconductor laser device, generally uses Zn as a dopant of the p-type cladding layer. Therefore, as is pointed out in Japanese Laid-Open Patent Publication No. 4-74487, the diffusion of Zn toward an active layer induces a problem. Moreover, as indicated in Japanese Laid-Open Patent Publication No. 4-317385, the second growth process for forming a current blocking layer, or the third growth process which is performed as needed, causes Zn to pile up in the GaInP active layer. As a result, the deterioration of laser characteristics, such as the increase in oscillation threshold current and the degradation of temperature characteristics, is induced. All these problems result from the diffusion of Zn contained in the p-type cladding layer as a dopant at a high concentration so as to prevent the electrons from overflowing from the active layer.

In order to increase a light-emitting efficiency of a semiconductor laser device which has a doublehetero junction structure including the AlGaInP active layer, it is disclosed, for example, in Japanese Laid-Open Patent Publication No. 6-302852 that the concentration of a residual impurity such as oxygen (O) and Si in the active layer is set at $5 \times 10^{16}$ cm$^{-3}$ or lower. The above publication also discloses, besides the normal active layer consisting of the AlGaInP layer, a structure using an active layer having a multi-quantum well structure. However, this publication merely discloses the relationship between the concentration of the residual impurity such as O and Si in the active layer and the light-emitting efficiency, and does not teach a dopant of the p-type AlGaInP layer.

In order to overcome the problems resulting from the diffusion of Zn as described above, a method using Be as a dopant of the p-type cladding layer has been proposed. In relation with this method, for example, J. Appl. Phys., 48, 1278 (1977) describes that it is possible to dope GaAs with Be at a high concentration by an MBE method without causing any problem such as segregation and irregular diffusion of the dopant. Similar doping characteristics can be obtained even when AlGaInP is doped with Be.

Therefore, by growing the layered structure with a MBE method using Be as a p-type dopant to the p-type cladding layer, the Be diffusion into or Be accumulation (i.e., Be pile-up) in the active layer does not occur even when the p-type cladding layer is doped with Be (p-type dopant) at a high concentration. Accordingly, as a result of doping the p-type cladding layer with Be at a high concentration, it is possible to control the overflow of electrons so as to obtain a semiconductor laser device having excellent operational characteristics such as a low oscillation threshold current and good temperature characteristics.

However, in the case where a reliability test is performed for the semiconductor laser device having the aforementioned characteristics while keeping a light output constant, a driving current is gradually boosted to disadvantageously degrade the operational characteristics. This problem arises because Be serving as a p-type dopant is gradually diffused due to energy generated by non-radiative recombination and increases in temperature in the vicinity of the active layer while emitting light, thereby adversely affecting the operational characteristics of the semiconductor laser device.

SUMMARY OF THE INVENTION

The semiconductor light-emitting device of the present invention has a doublehetero junction structure including an active layer made of GaInP or AlGaInP interposed between a p-type AlGaInP cladding layer and an n-type AlGaInP cladding layer, each having a band gap larger than that of the active layer. The p-type cladding layer contains Be as a p-type dopant, and each of the p-type cladding layer and the active layer contain Si.

Preferably, a light guiding layer is provided between the active layer and the n-type cladding layer, and the light guiding layer is doped with Si. Alternatively, a light guiding layer is provided between the active layer and the p-type cladding layer, and the light guiding layer is doped with Si.

Further alternatively, a first light guiding layer is provided between the active layer and the n-type cladding layer, and a second light guiding layer is provided between the active layer and the p-type cladding layer. Each of the first and second light guiding layers is doped with Si.

In one embodiment, the active layer has a multiquantum well structure including at least one quantum well layer and at least one quantum barrier layer.

According to the present invention, in a doubleheterojunction structure of a semiconductor laser, at least a p-type cladding layer is doped with Be as a p-type dopant. Furthermore, an active layer and the p-type cladding layer, which are not conventionally doped with an n-type dopant, are doped with Si which can function as the n-type dopant. Be serving as the p-type dopant captures an electron to have a negative charge, while Si serving as the n-type dopant releases an electron to have a positive charge. Therefore, Be and Si attract each other as having the opposite types of charges. The p-type cladding layer doped with Be as the p-type dopant and the active layer, in which the diffusion of Be from the p-type cladding layer is expected, are doped with Si which can serve as the n-type dopant. As a result, even when the p-type cladding layer is doped with Be (p-type dopant) at a high concentration, Be is inhibited from being diffused. Furthermore, by thus doping Si, Be is inhibited from being diffused during the operation due to energy generated by non-radiative recombination and increases in temperature in the vicinity of the active layer.

In order to increase a light confinement coefficient for the active layer, a light guiding layer may be additionally provided for the doublehetero junction structure of the present invention. The light guiding layers may be provided between the active layer and the n-type cladding layer and/or between the active layer and the p-type cladding layer. In such a case, the light guiding layer is also doped with Si so as to inhibit the Be diffusion into the light guiding layer.

The active layer may be constituted to have a quantum well structure in order to lower a threshold current density. In such a case, a quantum well layer and a quantum barrier layer included in the quantum well structure are doped with Si to inhibit Be from being diffused therein.

Thus, the invention described herein makes possible the advantage of providing a semiconductor light-emitting device, in which the overflow of electrons from an active layer is controlled by doping layers present in the periphery of the active layer with Be as the p-type dopant at a high concentration to provide excellent operational characteristics and a p-type dopant is inhibited from being diffused during the operation to provide high reliability even while operating at a high output power and at a high temperature.

This and other advantages of the present invention will become apparent to those skilled in the art upon reading and understanding the following detailed description with reference to the accompanying figures.

DESCRIPTION OF THE PREFERRED EMBODIMENTS

Prior to the description of examples of the present invention, the experimental results obtained by the inventors of the present invention for evaluating the characteristics of Be as a p-type dopant are first described with reference to FIGS. 5 and 6.

Figure 5:
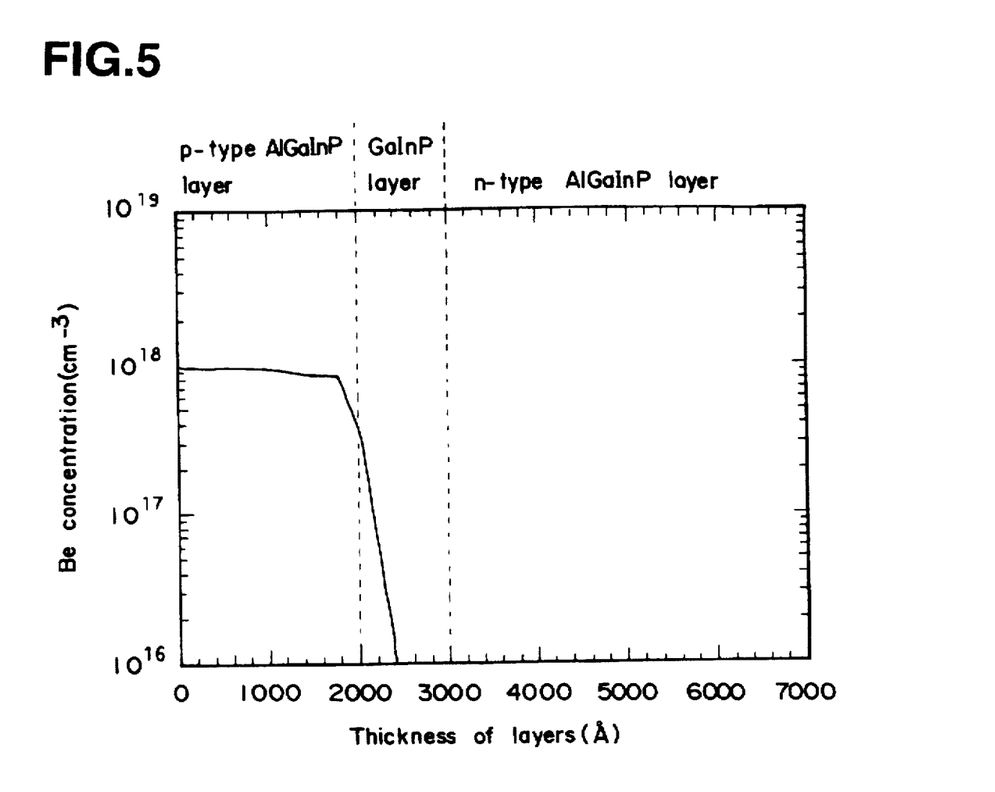
FIG. 5 is a graph illustrating the result of SIMS analysis for a Be concentration profile after the growth process, which shows the characteristics of Be as a p-type dopant.

FIG. 5 is a graph showing the result of the analysis of a concentration profile of Be serving as a dopant by a secondary ion mass spectrometer (SIMS) method, which was conducted for an evaluation sample fabricated by an MBE method. The evaluation sample was formed by growing a non-doped GaInP layer and an n-type AlGaInP layer each having a thickness of about 1000 angstrom so as to be adjacent to a p-type AlGaInP layer doped with Be at a concentration of about $1 \times 10^{18}$ cm$^{-3}$.

The concentration profile of Be shown in FIG. 5 suddenly drops at the boundary between the p-type AlGaInP layer and the non-doped GaInP layer. This signifies that, unlike the case where Zn is used as a p-type dopant (not shown), Be is only slightly diffused in the process for growing the non-doped GaInP layer and the n-type AlGaInP layer on the AlGaInP layer doped with Be, and therefore the amount of diffused Be is negligible.

Figure 6:
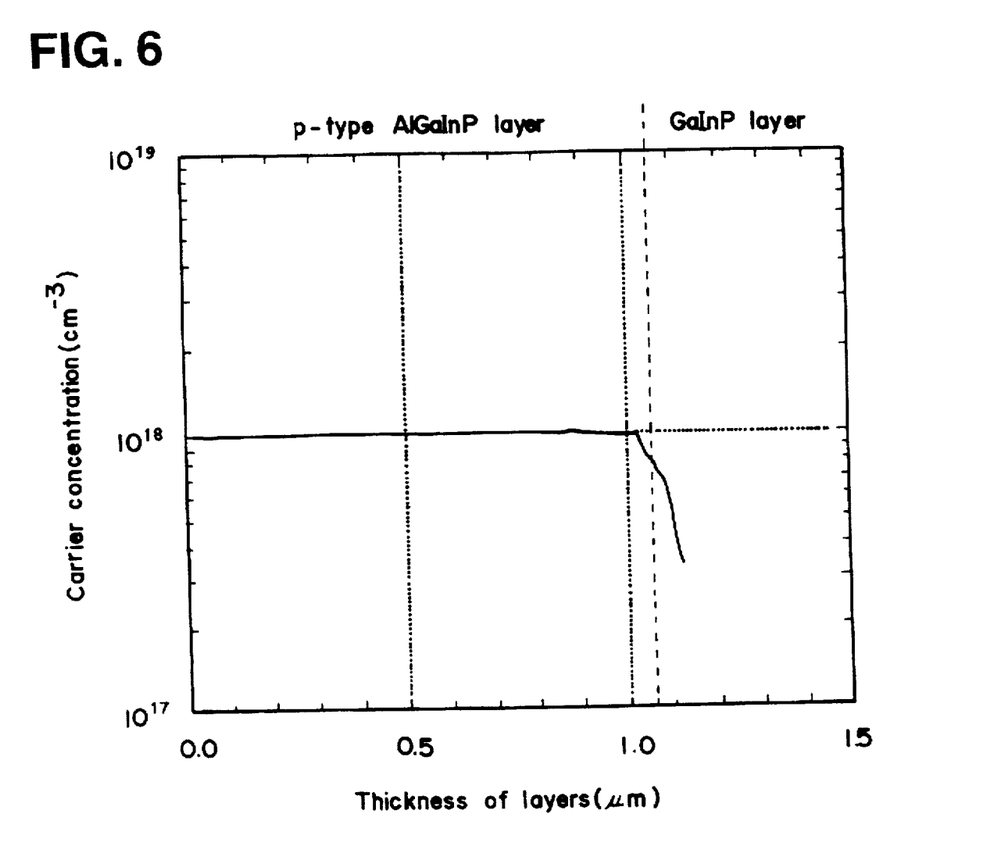
FIG. 6 is a graph illustrating the result of capacitance-voltage measurement for a carrier concentration profile after the growth process, which shows the characteristics of Be as a p-type dopant.

FIG. 6 is a graph showing the result of the analysis of a carrier concentration profile after the growth process (corresponding to a second growth process) of a non-doped layer by a capacitance-voltage (CV) method, which was conducted for an evaluation sample. The evaluation sample was formed by growing a non-doped GaInP layer (corresponding to the active layer) so as to be adjacent to the p-type AlGaInP layer doped with Be at a concentration of about $1 \times 10^{18}$ cm$^{-3}$.

The carrier concentration profile shown in FIG. 6 suddenly drops at the boundary between the p-type AlGaInP layer and the non-doped GaInP layer. This means that, unlike the case where Zn is used as a p-type dopant (not shown), Be serving as a p-type dopant only slightly accumulates (i.e., piles up) in the GaInP layer in the process for growing the non-doped GaInP layer on the AlGaInP layer doped with Be serving as a p-type dopant.

As described above, it is confirmed that problems such as diffusion and accumulation (pile-up) of the p-type dopant do not arise when Be is used as a p-type dopant.

Hereinafter, the present invention will be described by way of an illustrative example with reference to the drawings.

Figure 1A:
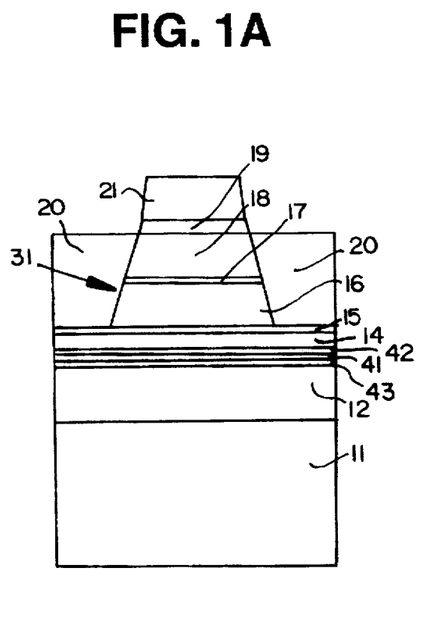
FIGS. 1A to 1C are cross-sectional views showing the fabrication process of a semiconductor laser device of an example of the present invention.
Figure 1B:
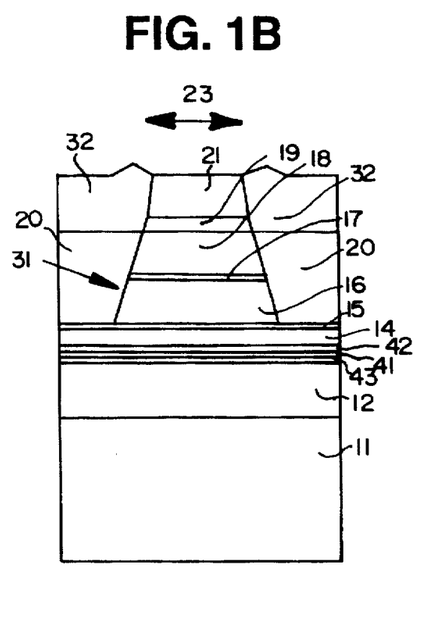
Figure 1C:
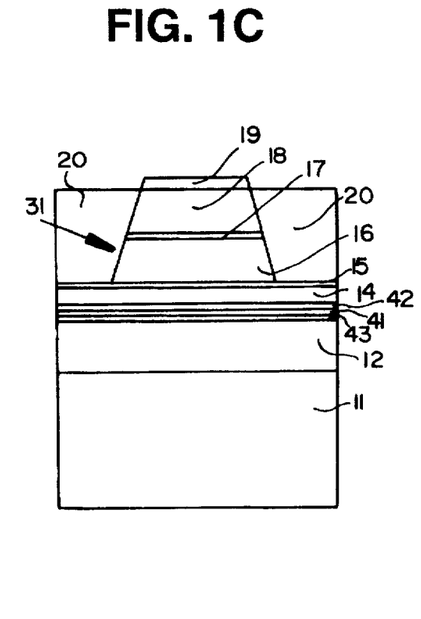
Figure 1D:
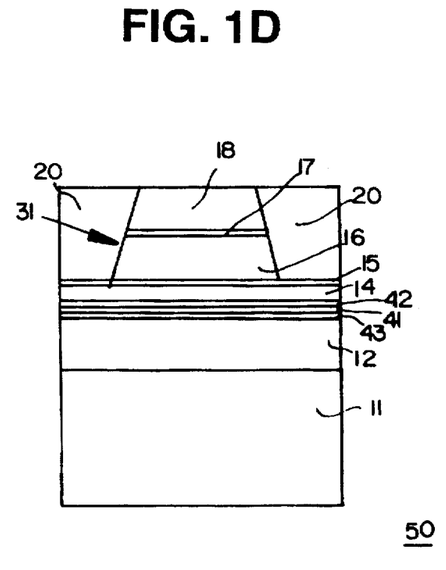
FIG. 1D is a cross-sectional view showing the structure of a semiconductor laser device fabricated by the process shown in FIGS. 1A to 1C.

FIG. 1D is a cross-sectional view showing a semiconductor laser device 50 of a refractive index guiding type in an example of the present invention.

This semiconductor laser device 50 includes an n-type AlGaInP cladding layer 12, an AlGaInP light guiding layer 43, a multi-quantum well active layer 41, an AlGaInP light guiding layer 42, a p-type AlGaInP lower cladding layer 14, a p-type GaInP etching stop layer 15, a p-type AlGaInP upper cladding layer 16, a p-type GaInP intermediate band gap layer 17 and a p-type GaAs contact layer 18. These layers are successively deposited on an n-type GaAs substrate 11 in this order. The p-type AlGaInP upper cladding layer 16, the p-type GaInP intermediate band gap layer 17 and the p-type GaAs contact layer 18 form a stripe-shaped mesa 31. N-type GaAs current blocking layers 20 are formed on both sides of the mesa 31 so as to bury the mesa 31.

Figure 2:
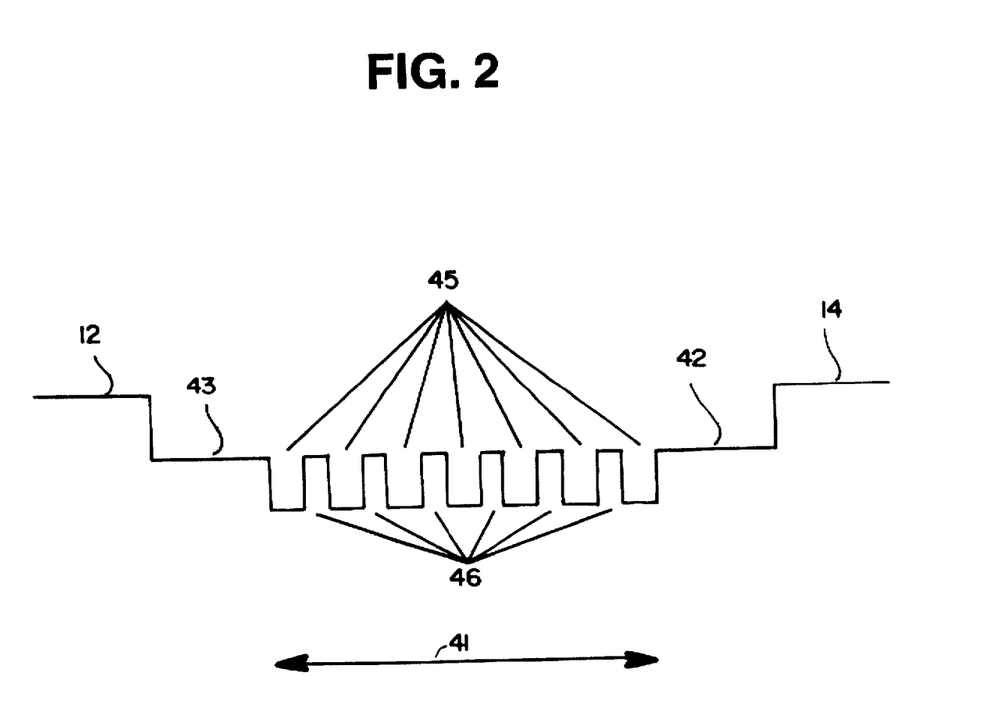
FIG. 2 is a cross-sectional view showing the structure of an active layer of the semiconductor laser device of the present invention shown in FIG. 1D.

The active layer 41 has a multi-quantum well structure. More specifically, as shown in FIG. 2, seven (7) GaInP quantum-well layers 45 and six (6) AlGaInP quantum barrier layers 46 are deposited in an alternating manner so as to be interposed between the AlGaInP light guiding layer 43 and the AlGaInP light guiding layer 42, thereby constituting the active layer 41. The above structure is further interposed between the n-type AlGaInP cladding layer 12 and the p-type AlGaInP lower cladding layer 14.

The semiconductor laser device 50 is fabricated, for example, in the following manner as shown in FIGS. 1A to 1C.

First, the n-type AlGaInP cladding layer 12, the AlGaInP light guiding layer 43, the multi-quantum well active layer 41, the AlGaInP light guiding layer 42, the p-type AlGaInP lower cladding layer 14, the p-type GaInP etching stop layer 15, the p-type AlGaInP upper cladding layer 16, the p-type GaInP intermediate band gap layer 17 and the p-type GaAs contact layer 18 are successively formed on the n-type GaAs substrate 11 by an MBE method in a first growth process. The n-type AlGaInP cladding layer 12 and the p-type AlGaInP cladding layers 14 and 16 are formed at a composition ratio of $(Al_yGa_{1-y})_xIn_{1-x}P$ (x–0.5 and y=0.7).

The doping for each of the layers in the aforementioned growth process is performed as follows.

The n-type cladding layer 12 is doped with Si serving as an n-type dopant, while the p-type cladding layers 14 and 16 are doped with Be serving as a p-type dopant. Furthermore, the AlGaInP light guiding layer 43, the multi-quantum well active layer 41, the AlGaInP light guiding layer 42, the p-type AlGaInP lower cladding layer 14, and the p-type AlGaInP upper cladding layer 16 are doped with Si which can serve as an n-type dopant. In this case, the doping is preferably performed so that an Si concentration is the same in the AlGaInP light guiding layer 43, the multi-quantum well active layer 41, the AlGaInP light guiding layer 42, the p-type AlGaInP lower cladding layer 14 and the p-type AlGaInP upper cladding layer 16. This enables a crucible temperature of Si in an MBE apparatus to be set at the same temperature throughout the growth process after the formation of the AlGaInP light guiding layer 43. Thus, the growth process can be simplified.

In the case where the active layer 41, the p-type cladding layers 14 and 16 and the light guiding layers 43 and 42 are doped with too much Si which can serve as an n-type dopant, a light-emitting efficiency in the active layer 41 is lowered while an effective concentration of holes is lowered because of the compensation with a p-type dopant in the p-type cladding layers 14 and 16. When photoluminescence intensity is measured by using an evaluation sample having a structure similar to that of the active layer shown in FIG. 2, the photoluminescence intensity is hardly lowered with a doping concentration of Si of about $5\times10^{17}$ cm$^{-3}$ or lower, preferably about $1 \times10^{17}$ cm$^{-3}$ or lower. When the doping concentration of Si is at such a level, the amount of carriers to be compensated in the p-type cladding layers 14 and 16 is small. Therefore, the operational characteristics of the semiconductor laser device 50 are not adversely affected thereby.

On the other hand, it is desirable that a doping concentration of Be in the p-type cladding layers 14 and 16 is high, for example, in the range of about $8\times10^{17}$ cm$^{-3}$ to about $2\times10^{18}$ cm$^{-3}$, in order to control the overflow of electrons from the active layer 41.

A specific doping concentration in each of the layers in this example is as follows.

The n-type AlGaInP cladding layer 12 is doped with Si at about $1\times10^{18}$ cm$^{-3}$; the AlGaInP light guiding layer 43 is doped with Si at about $1\times10^{17}$ cm$^{-3}$; the well layers 45 and the barrier layers 46 included in the multi-quantum well active layer 41 are doped with Si at about $1\times10^{17}$ cm$^{-3}$; the AlGaInP light guiding layer 42 is doped with Si at about $1\times10^{17}$ cm$^{-3}$; and the p-type AlGaInP lower cladding layer 14 and the p-type AlGaInP upper cladding layer 16 are doped with Si at about $1\times10^{17}$ cm$^{-3}$ and Be at about $1\times10^{18}$ cm$^{-3}$, respectively.

Next, on the thus formed layered structure, an $Al_2O_3$ film is deposited, and is then patterned into a stripe-shape by photolithography to form a mask layer 19. By performing wet etching using the mask layer 19, part of the contact layer 18, the intermediate band gap layer 17 and the p-type upper cladding layer 16, which is not covered with the mask layer 19, is removed. As a result, the mesa 31 is formed immediately below the mask layer 19 as shown in FIG. 1A. In the case where the p-type AlGaInP upper cladding layer 16 is removed by etching, it is ensured that etching can be stopped at a desired position by utilizing the selectivity of the etching between the p-type GaInP etching stop layer 15 and the p-type AlGaInP upper cladding layer 16.

Thereafter, as the second growth process, the n-type GaAs current blocking layers 20 are grown on both sides of the mesa 31 by the MBE method so as to have a convex-shaped cross section. In this growth step, an n-type GaAs polycrystalline layer 21 is formed on the $Al_2O_3$ film 19.

Next, a photoresist 32 is applied onto the layered structure formed in the above process. An opening 23 is formed by photolithography at the position corresponding to the n-type GaAs polycrystalline layer 21 as shown in FIG. 1B so as to expose the n-type GaAs polycrystalline layer 21 therethrough.

Subsequently, the n-type GaAs polycrystalline layer 21 is selectively etched away while leaving the $Al_2O_3$ film 19, using a sulfuric acid type etchant. Then, the photoresist 32 is removed by ashing, thereby obtaining the structure shown in FIG. 1C.

Then, as shown in FIG. 1D, the $Al_2O_3$ film 19 is etched away using a hydrofluoric acid type etchant. Furthermore, electrodes (not shown) are formed on the top surface of the contact layer 18 and the bottom face of the substrate 11, respectively, thereby completing the semiconductor laser device 50.

The result of a reliability test conducted for the thus obtained semiconductor laser device 50 and a conventional semiconductor laser device fabricated for comparison is described below. More specifically, a driving current (operating current) Iop with elapse of time is measured.

Figure 3A:
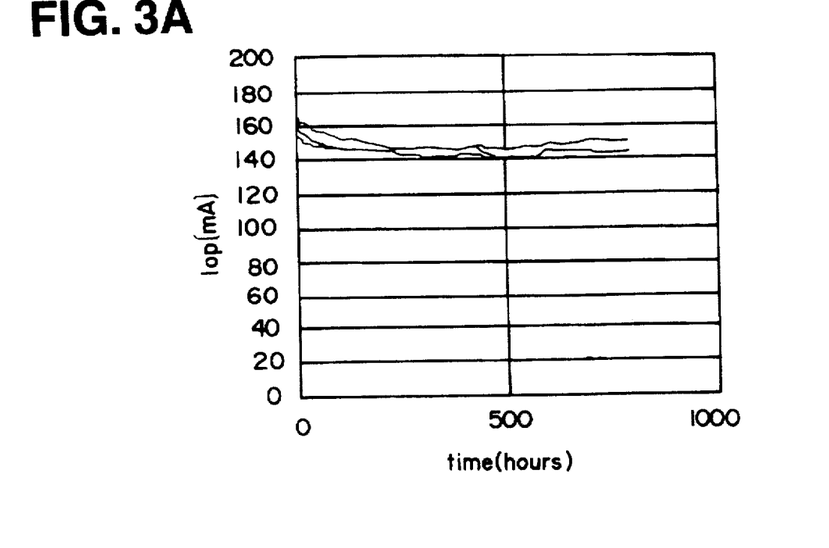
FIG. 3A is a graph showing the result of a reliability test conducted for the semiconductor laser device of the present invention shown in FIG. 1D.
Figure 3B:
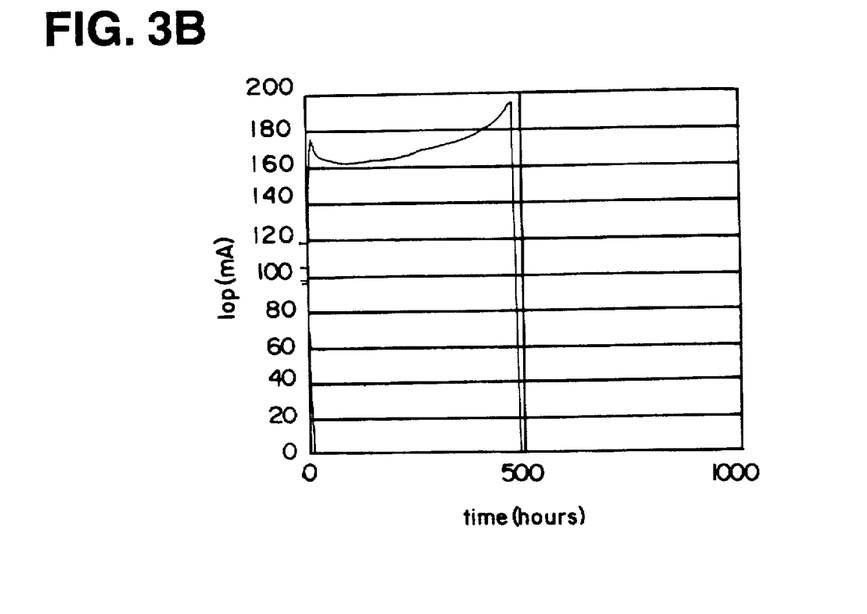
FIG. 3B is a graph showing the result of a reliability test conducted for a conventional semiconductor laser device.

FIG. 3A shows the result of a reliability test conducted for the semiconductor laser device 50 shown in FIG. 1D according to the present invention. FIG. 3B shows the result of a reliability test conducted for a conventional semiconductor laser device. The conventional semiconductor laser device used for this reliability test was fabricated in the same manner as that of the semiconductor laser device 50 of the present invention shown in FIG. 1D except that the light guiding layers 43 and 42, the multi-quantum well active layer 41 and the p-type cladding layers 14 and 16 are not doped with Si which can serve as an n-type dopant.

As shown in FIG. 3A, the semiconductor laser device 50 of the present invention has a long lifetime without causing the driving current Iop to increase with elapse of time. On the other hand, as shown in FIG. 3B, an increase in the driving current Iop with elapse of time is measured in the conventional semiconductor laser device. Moreover, this conventional semiconductor laser device has a lifetime of only 500 hours or less.

The semiconductor laser device 50 according to the present invention differs from the conventional semiconductor laser device in that the light guiding layers 43 and 42, the multi-quantum well active layer 41 and the p-type cladding layers 14 and 16 are doped with Si which can serve as an n-type dopant in the semiconductor laser device 50. From this fact, it is considered that, according to the present invention, the long lifetime of the semiconductor laser device is realized because the diffusion of Be (p-type dopant) is prevented by doping Si.

As described above, the semiconductor laser device according to the present invention is characterized in that the active layer, the light guiding layers and the p-type cladding layer, which are not normally doped with an n-type dopant, are doped with Si which can serve as an n-type dopant so as to prevent Be serving as a p-type dopant in the p-type cladding layer from being diffused. The structure in which the above aspect can be realized is not limited to the one described above in the aforementioned example.

For example, in the aforementioned semiconductor laser device 50, the light guiding layer 42 is formed between the active layer 41 and the n-type cladding layer 12 while the light guiding layer 43 is formed between the active layer 41 and the p-type cladding layer 14, thereby improving a light confinement coefficient. Alternatively, the present invention is applicable to the case where only one of the light guiding layers 42 and 43 is provided for the semiconductor laser device, and even to the case where no light guiding layer is provided.

In the semiconductor laser device 50 described above, the active layer 41 included in the doublehetero junction structure has a multi-quantum well structure so as to reduce a threshold current density. Alternatively, the semiconductor laser device can be configured to have a doublehetero junction structure including an active layer of a single quantum well structure or a doublehetero junction structure including a normal active layer which does not have a quantum well structure.

Furthermore, the semiconductor laser device 50 has a refractive index guiding type structure in which the mesa 31 including the upper cladding layer 16, the intermediate band gap layer 17 and the contact layer 18 is buried by the current blocking layers 20 on both sides. Alternatively, the semiconductor laser device 50 may have another structure as long as it has a doublehetero junction structure including at least an active layer made of GaInP or AlGaInP interposed between a p-type AlGaInP cladding layer and an n-type AlGaInP cladding layer, each having a band gap larger than that of the active layer. Moreover, in the doublehetero junction structure, the p-type cladding layer, the active layer and the n-type cladding layer may be formed in a reverse order.

In the above description, each of the layers included in the layered structure constituting the semiconductor laser device is grown by the MBE method. However, other methods can be used as long as they can use Si as a dopant. For example, a gas source MBE method or a chemical beam epitaxy (CBE) method can be used.

Furthermore, the application of the present invention is not limited to the aforementioned semiconductor laser device. The present invention is generally applicable to a semiconductor light-emitting device emitting light other than a laser light beam.

According to the present invention, as is apparent from the above description, in the semiconductor light-emitting device having a doublehetero junction structure including the active layer, the n-type cladding layer and the p-type cladding layer doped with Be as a p-type dopant, it is possible to prevent Be serving as the p-type dopant from being diffused by doping the active layer and the p-type cladding layer with Si which can serve as an n-type dopant. Even when the semiconductor light-emitting device is intended to oscillate with a short wavelength and at a high output power by doping the p-type cladding layer with the p-type dopant at a high concentration, the operational characteristics do not deteriorate. In addition, the reliability is not lowered even when operating at a high temperature and at a high output power. Therefore, a low oscillation threshold current, excellent temperature characteristics and high reliability can be realized simultaneously.

Additionally, a light confinement coefficient to the active layer can be increased by providing light guiding layers between the active layer and the n-type cladding layer and/or between the active layer and the p-type cladding layer. In this case, the light guiding layers can be also doped with Si. Thus, the p-type dopant is inhibited from being diffused to simultaneously realize a low oscillation threshold current, excellent temperature characteristics and high reliability.

Furthermore, the active layer may have a quantum well structure so as to reduce a threshold current density. In this case, a quantum well layer and a quantum barrier layer included in the quantum well structure of the active layer can be also doped with Si so as to inhibit the p-type dopant from being diffused to simultaneously realize a low oscillation threshold current, good temperature characteristics and high reliability.

When the semiconductor light-emitting device according to the present invention which has the above described excellent characteristics is used as a light source for recording and reading out information of a light information processing system or the like, recording information at a high density and overwriting information at a high speed can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device having a doublehetero junction structure including an active layer made of GaInP or AlGaInP interposed between a p-type AlGaInP cladding layer and an n-type AlGaInP cladding layer, each having a band gap larger than that of the active layer, wherein the p-type cladding layer contains Be as a p-type dopant, and each of the p-type cladding layer and the active layer contain Si as a dopant.

2. A semiconductor light-emitting device according to claim 1, wherein a light guiding layer is provided between the active layer and the n-type cladding layer, and the light guiding layer is doped with Si.

3. A semiconductor light-emitting device according to claim 1, wherein a light guiding layer is provided between the active layer and the p-type cladding layer, and the light guiding layer is doped with Si.

4. A semiconductor light-emitting device according to claim 1, wherein a first light guiding layer is provided between the active layer and the n-type cladding layer, and a second light guiding layer is provided between the active layer and the p-type cladding layer, each of the first and second light guiding layers being doped with Si.

5. A semiconductor light-emitting device according to claim 1, wherein the active layer has a multi-quantum well structure including at least one quantum well layer and at least one quantum barrier layer.

* * * * *